(12) United States Patent
Hartig et al.

(10) Patent No.: US 8,435,388 B2
(45) Date of Patent: May 7, 2013

(54) REACTIVE SPUTTER DEPOSITION PROCESSES AND EQUIPMENT

(75) Inventors: Klaus Hartig, Avoca, WI (US); Sören Berg, Uppsala (SE); Tomas Nyberg, Uppsala (SE)

(73) Assignee: Cardinal CG Company, Eden Prairie, MN (US)

( * ) Notice: Subject to any disclaimer, the term of this patent is extended or adjusted under 35 U.S.C. 154(b) by 1291 days.

(21) Appl. No.: 11/590,438

(22) Filed: Oct. 31, 2006

(65) Prior Publication Data

US 2007/0131536 A1 Jun. 14, 2007

Related U.S. Application Data

(60) Provisional application No. 60/732,590, filed on Nov. 1, 2005.

(51) Int. Cl.
C23C 14/35 (2006.01)

(52) U.S. Cl.
USPC ............ 204/192.12; 204/192.15; 204/192.22; 204/192.25; 204/192.26; 204/298.07; 204/298.11; 204/298.12; 204/298.13; 204/298.2

(58) Field of Classification Search ............ 204/298.07, 204/298.11, 298.12, 298.13, 192.12, 192.15, 204/192.22, 192.25, 192.26, 298.2
See application file for complete search history.

(56) References Cited

U.S. PATENT DOCUMENTS

| | | | |
|---|---|---|---|
| 3,864,239 A | 2/1975 | Fletcher | |
| 4,434,037 A | 2/1984 | Crank | |
| 4,572,842 A * | 2/1986 | Dietrich et al. | 427/571 |
| 4,865,709 A | 9/1989 | Nakagawa | |
| 4,915,810 A | 4/1990 | Kestigian | |
| 5,085,926 A * | 2/1992 | Iida et al. | 428/216 |
| 5,100,527 A | 3/1992 | Stevenson | |
| 5,320,729 A | 6/1994 | Narizuka | |
| 5,489,367 A * | 2/1996 | Kubota et al. | 204/192.15 |
| 5,514,485 A | 5/1996 | Ando | |
| 5,685,959 A | 11/1997 | Bourez | |
| 5,976,326 A | 11/1999 | Ranjan | |
| 6,051,113 A | 4/2000 | Moslehi | |
| 6,106,676 A * | 8/2000 | Terry et al. | 204/192.13 |
| 6,183,614 B1 | 2/2001 | Fu | |

(Continued)

FOREIGN PATENT DOCUMENTS

| | | | |
|---|---|---|---|
| JP | 2003-013216 | * | 1/2003 |
| WO | WO 92/02659 A1 | | 2/1992 |
| WO | WO 01/23634 A1 | | 4/2001 |
| WO | WO 03/006703 A1 | | 1/2003 |
| WO | WO 2005/111257 A2 | | 11/2005 |

OTHER PUBLICATIONS

Machine Translation of JP 2003-013216 dated Jan. 2003.*

(Continued)

*Primary Examiner* — Rodney McDonald
(74) *Attorney, Agent, or Firm* — Fredrikson & Byron, P.A.

(57) ABSTRACT

The invention is a method for obtaining a reactive sputtering process with a reduced or eliminated hysteresis behavior. This is achieved by employing a target made from a mixture of metal and compound materials. In the method according to the present invention, the fraction of compound material is large enough to eliminate or significantly reduce the hysteresis behavior of the reactive sputtering process and enable a stable deposition of compound films at a rate significantly higher than what is possible from a target completely made from compound material.

25 Claims, 6 Drawing Sheets

U.S. PATENT DOCUMENTS

| | | |
|---|---|---|
| 6,193,856 B1 | 2/2001 | Kida et al. |
| 6,334,938 B2 | 1/2002 | Kida et al. |
| 6,365,010 B1 | 4/2002 | Hollars |
| 6,461,686 B1 | 10/2002 | Vanderstraeten |
| 6,468,402 B1 | 10/2002 | Vanderstraeten |
| 6,787,003 B2 | 9/2004 | Hartig |
| 7,749,406 B2 * | 7/2010 | Stevenson et al. ............ 252/500 |
| 2003/0159925 A1 * | 8/2003 | Sako ........................ 204/298.07 |
| 2004/0069623 A1 | 4/2004 | Vanderstraeten |
| 2004/0104110 A1 * | 6/2004 | Lee ........................... 204/192.1 |
| 2004/0110042 A1 | 6/2004 | Holesinger |

OTHER PUBLICATIONS

International Search Report, dated May 21, 2007 for PCT Application No. PCT/US2006/042391, 7 pages.
Written Opinion, dated May 21, 2007 for PCT Application No. PCT/US2006/042391, 9 pages.
International Preliminary Report on Patentability, dated Jun. 5, 2008 for PCT Application No. PCT/US2006/042391, 10 pages.

* cited by examiner

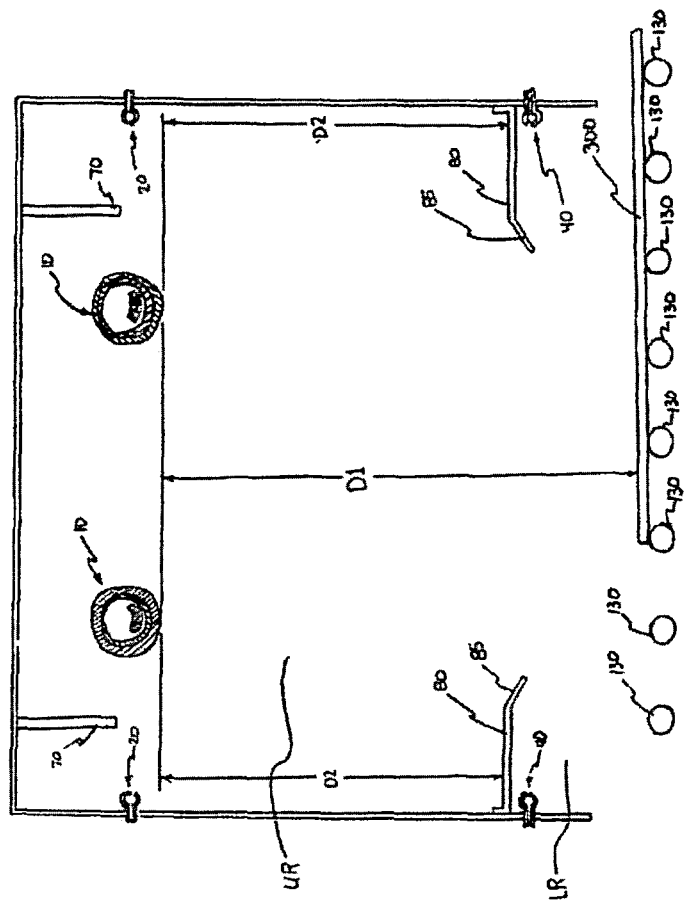

REACTIVE SPUTTER DEPOSITION PROCESSES AND EQUIPMENT

CROSS-REFERENCE TO RELATED APPLICATION

The present application claims priority to U.S. Application No. 60/732,590, filed Nov. 1, 2005, the entire disclosure of which is incorporated herein by reference.

FIELD OF THE INVENTION

The present invention relates to reactive sputter deposition processes. In particular, the invention provides processes and equipment for reactive sputtering.

BACKGROUND OF THE INVENTION

Sputtering is a preferred industrial thin film coating process. In this process, a target material is deposited over a substrate area. By bombarding the target with gas ions accelerated by a voltage, target atoms are caused to eject, or sputter, from the surface. Target particles then traverse the sputtering chamber and are deposited onto the substrate as a thin film.

By adding a reactive gas, such as oxygen, nitrogen, etc., to the sputtering process, it is possible to reactively sputter deposit thin films of oxides, nitrides, etc. The reactive sputtering process has found widespread applications in, for example, the coating of tools, decorative coatings, window glasses, plastic webs, electronic components, data-storage components, etc. Due to its highly complicated behavior, the reactive sputtering process is associated with a number of difficulties. The process usually exhibits a behavior presenting a hysteresis effect, which makes it difficult to control. Sophisticated feed-back control systems must be used to be able to operate inside the hysteresis region. Such systems have been developed and are commercially available, but they are expensive, require maintenance, and might fail to control the process sufficiently well. One way to obtain a stable process is to run the process in pure reactive gas and/or at a very high flow of reactive gas. The drawback here is that the deposition rate is much lower than the corresponding rate from a metallic target with a feed-back control system (sometimes as much as 10-20 times lower). The reason is that the reactive gas forms compound at the target surface, and this compound has a significantly lower sputtering yield than metal. A related issue is that the deposition of an insulating compound film from a metal target implies charging and subsequent arcing at the target.

The magnitude of the hysteresis effect is to some extent influenced by parameters like target material and reactive gas selection, e.g., sputtering yields and reactivity of the system. The hysteresis is in general more pronounced and disrupting for processes where the reactivity is higher. Therefore, gases with lower reactivity have been mixed in to reduce the hysteresis during sputtering from the target, while being on the substrate replaced by the more reactive compound-forming gas. There are other parameters that might influence the hysteresis effect. These parameters can be varied by designing the sputtering process and equipment in certain ways. One example is the pumping speed. The most common way to try and deal with hysteresis, so far, has been to increase the external pumping speed of reactive gas. This may sometimes be realized for small systems, but it leads to unrealistically high pumping speeds in large industrial systems. A further possibility is to employ a target made from a fully oxidized material. This will eliminate hysteresis, but the drawback is a large drop in deposition rate. Thus, there is a great demand for ways to reduce or eliminate hysteresis without an accompanying dramatic drop in the deposition rate.

As further background, for some sputtering applications it is favorable if a large fraction of the sputtered atoms is ionized. Firstly, the sputtered ions might be attracted to the substrate by applying a bias to the latter. This will add energy to the growing film, which is beneficial for the film growth. Secondly, the attracted ions will have a preferential perpendicular direction when arriving onto the substrate surface which enables deposition in groves and trenches. Thirdly, if the fraction of ions is sufficiently large, it may be possible to run the process in a self-sustained mode. This means that ions from the target material sputter themselves without addition of an extra (inert) gas. This will, of course, result in a much cleaner process where no inert gas species is contaminating the deposited film.

The fraction of ionized sputtered species is correlated to the target ion current density. A higher current density implies a larger fraction of ionized species. Generally, the maximum tolerable current density is limited by the efficiency of the target cooling system.

In an ideal controllable process, reactive sputtering would be carried out from a clean metal target and the metal atoms would react with the gas when arriving at the substrate. It would then be possible to change the compound concentration in the deposited film by the reactive gas flow. Unfortunately, it is difficult to obtain these ideal conditions because the reactive gas also reacts with the target, resulting is compound formation at the target.

To partly overcome the problem of charging and arcing during the deposition of insulating films, it is possible to increase the total gas pressure so that a substantial fraction of the sputtered metal from the high-erosion parts of the target scatters back onto the low-erosion parts of the target, thus making this part more metallic, which suppresses charging and subsequent arcing.

The concept of using a magnet that moves relative to the target to induce a moving erosion area is described in several patents and patent applications, see for example U.S. Pat. No. 6,183,614, WO 01/23634 and WO 92/02659. In U.S. Pat. No. 6,183,614, asymmetric magnetic fields are introduced in order to achieve advantageous high-density plasma sputtering. WO 01/23634 uses a plurality of magnets to induce a magnetic field having a predefined arbitrary shape and thereby improve material utilization. An alternative target setup is disclosed in WO 92/02659, which employs a cylindrical magnetron for the purpose of reducing arcing.

Industrial sputtering operations consume enormous quantities of power. Therefore, a significant improvement in terms of sputtering efficiency can save large amounts of energy. Given the current drive for energy conservation, and the rising costs of energy, sputtering efficiency is of great importance, particularly for large scale coated glass manufacturers.

Thus, many problems associated with reactive sputtering processes remain and there is strong demand for improved reactive sputtering processes and equipment.

SUMMARY OF THE INVENTION

Certain embodiments of the present invention provide a reactive sputtering process having a reduced (e.g., significantly reduced) or eliminated hysteresis behavior, where the deposition rate of a compound film (in some of these embodiments, a fully oxidized film) is higher than (optionally at least 20% higher than) a corresponding deposition rate from a target made entirely of compound material (such as that which results in using a fully oxidized target material).

Certain embodiments of the invention provide a method for obtaining a reactive sputtering process with a reduced (e.g., significantly reduced) or eliminated hysteresis behavior. This is achieved, at least in part, by employing a target made from a mixture of metal and compound materials. The metal can be an alloy or another type of metallic mixture. The compound material is a non-metallic material, such as an oxide, nitride, oxynitride, etc.

The inventors have discovered that both deposition rate and hysteresis width are affected when compound material is added to a metallic target. More compound material gives a lower deposition rate and a reduced hysteresis width. In other words, the price for reducing the hysteresis effect is a lower deposition rate. In certain methods of the invention, the fraction of compound material is large enough to reduce (e.g., significantly), or optionally to eliminate entirely, the hysteresis effect. At the same time, the fraction of compound material should be small enough to give a higher deposition rate (preferably a significantly higher deposition rate) of a desired compound film than the corresponding deposition rate from a target made completely from that compound material.

The thermal and/or electrical conductivities of the target material can be improved in comparison to a compound target (e.g., a full oxide target). As a result, more power can safely be applied and the resulting coating speed will be higher at the already improved rate.

The characteristics of the reactive sputtering process is dependent on a number of parameters like sputtering yields, pumping speed, reactivity, target area, substrate area, target ion current, etc. Therefore, it is difficult to predict a globally optimum fraction of compound material to be incorporated into the target. The optimum fraction may be different for different processes and can be dependent on reactive gas, target material, chamber setup, etc. In one exemplary embodiment, the target material comprises between 20% and 80%, such as between 30% and 50% (e.g., about 35%), compound material (optionally oxide material) with the remainder being the metallic material.

In some embodiments, the reactive sputtering process proceeds achieves the deposition of the compound film while consuming a sputtering energy that is 50% or less of the energy that would be consumed in producing a film having the same composition and thickness when either sputtering the noted metal target, which is completely made from the metal part, or the given target, which is completely made from the compound part.

In certain embodiment, the compound part of the sputterable target material includes a first compound and a second compound. In some embodiments of this nature, during the reactive sputtering process the metallic part forms the first compound more readily than it forms the second compound. Additionally or alternatively, the reactive sputtering process involves providing a gaseous sputtering atmosphere comprising two reactive gases of different chemical activities. In some such cases, during the reactive sputtering process, the deposition of the compound film results in the film containing a higher concentration of a desired one of the two reactive gases, and the desired one of the two reactive gases has a higher chemical activity than the other of the two reactive gases. The above-noted first compound can optionally be an oxide and the second compound can optionally be a nitride. In one embodiment of this nature, the first compound is titanium oxide and the second compound is titanium nitride.

An advantage of some embodiments of the invention is that they can be implemented on existing sputtering equipment since only the target needs to be replaced. Other embodiments involve a magnetic array (adapted to establish a reduced erosion area) and/or a shield that can be added advantageously to existing sputtering equipment.

Still further, certain methods of the invention provide a reactive sputtering process having a reduced (e.g., significantly reduced) or eliminated hysteresis behaviour, in which the ion target current density in the sputtering process is increased by reducing the area from which sputtering takes place. To compensate for the increased local heating, the reduced area from which sputtering takes place moves along the target.

It should be noted that for certain combinations of target materials and requirements on the deposition rate, the target will not melt during operation even at static conditions, in particular if the power is switched on and off, so that the average power is less than the power needed to cause local heating of the target. Nevertheless, the maximum deposition rate can be increased if the power is spread out over a larger area. It is, however, desirable in some embodiments that the reduced area be small enough to obtain a reactive sputtering process with eliminated or at least significantly reduced hysteresis. In some embodiments, it is also, especially in connection with industrial applications with high requirements for efficient processes, desirable that the reduced area is moving (e.g., relative to the sputtering plasma which is confined by a stationary magnetic field) at a speed high enough to prevent local melting of the target.

Such method embodiments have several advantages compared to conventional sputtering techniques. As a consequence of the high current density, the fraction of ionized sputtered species will increase dramatically, which is desirable for the reasons given above. Another advantage is that the above-described problems associated with a sputtering process operating in reactive mode, particularly the problem with hysteresis, will be reduced (e.g., significantly) or eliminated. Further, the problem with arcing during reactive sputtering will be suppressed, since the insulating compound material at the target is effectively sputter-removed when current density is sufficiently high. Finally, the increased ionization rate enables sputtering at lower pressure.

One group of embodiments provides a method for obtaining a reactive sputtering process with a reduced (e.g., significantly reduced) or eliminated hysteresis behavior. In the present group, the method comprises employing a desired sputterable target material comprising (optionally consisting essentially of) a mixture of: one metallic part (which can be a single continuous area, or a plurality of different areas, forming such metallic part) consisting essentially of one or several metals (here, the term metal is defined to include semi-metals) and/or one or several semiconducting materials, and; one compound part consisting essentially of one or several compound materials (oxides, nitride, oxynitrides, etc.). Here, the relative amount of compound part preferably is large enough to: eliminate or reduce (e.g., significantly reduce) the hysteresis behavior of the reactive sputtering process as compared to reactively sputtering (e.g., so as to deposit a corresponding film using a corresponding sputtering system) a metal target completely made from the metallic part, and; enable a stable deposition of a compound film at a rate higher (e.g., significantly higher, such as optionally at least 20% higher) than what is possible from a given target completely made from the compound part. In some embodiments of the present group, the reactive sputtering process is DC, mid-frequency (i.e., between 10 kHz and 100 kHz), or RF sputtering. In one such embodiment, the sputtering process is selected from the group consisting of DC sputtering and mid-frequency sputtering. Additionally or alternatively, the desired target can have a composition selected to have an electrical conductivity that is at least twice that of the given target, which is completely made from the compound part. Further, the desired target can optionally have a composition selected to have a thermal conductivity that is at least twice that of the given target, which is completely made from the compound part.

In certain embodiments, the mixture for the desired target is selected so that the stable deposition of the compound film proceeds with the rate being at least 40%, preferably at least 50%, and perhaps more preferably at least 60%, that achieved by reactively sputtering (e.g., using the same system) the metal target (so as to achieve a film having the same composition as said compound film), which is completely made from the metallic part. In some embodiments of this nature, the compound film is an oxide film, and the reactive sputtering process is carried out such that this oxide film is fully oxidized or at least substantially fully oxidized (e.g., at least 80% oxidized, or even at least 85% oxidized).

Similarly, the mixture for the desired target can optionally be selected so that the stable deposition of the compound film proceeds with the rate being at least 20% greater than, perhaps preferably at least 40% greater than, and perhaps more preferably at least 50% greater than, that achieved by reactively sputtering the compound target (e.g., so as to deposit a corresponding film using a corresponding sputtering system), which is completely made from the compound part. In some embodiments of this nature, the compound film is an oxide film, and the reactive sputtering process is carried out such that this oxide film is fully oxidized or at least substantially fully oxidized (e.g., at least 80% oxidized, or even at least 85% oxidized).

In certain embodiments of the present group, the method is performed such that after a disruption of the reactive sputtering process, the process returns to a working point by which the stable deposition of the compound film was characterized prior to the disruption. This means that the sputtering process was (prior to interruption) proceeding stably at a working point characterized by a certain sputtering erosion rate and amount of compound in the film being deposited, and after the interruption the process returns to proceeding stably at substantially the same working point. For purposes of this disclosure, the term disruption refers to either: (1) a disturbance where the sputtering power (i.e., the power to the target) is interrupted, decreases to zero, and then comes back to its pre-interruption level, or: (2) a disturbance where the sputtering gas flow is interrupted, decreases to zero, and then comes back to its pre-interruption level.

In one subgroup of the present embodiment group, the metallic part comprises (e.g., consists essentially of) Ti and Si and the compound part comprises (e.g., consists essentially of) titanium oxide.

In another subgroup of the present embodiment group, the metallic part comprises (e.g., consists essentially of) Ti and the compound part comprises (e.g., consists essentially of) silicon oxide and titanium oxide.

In still another subgroup of the present embodiment group, the metallic part comprises (e.g., consists essentially of) Si and the compound part comprises (e.g., consists essentially of) titanium oxide.

In yet another subgroup of the present embodiment group, the metallic part comprises (e.g., consists essentially of) Ti and the compound part comprises (e.g., consists essentially of) silicon oxide and titanium nitride.

In still another subgroup of the present embodiment group, the metallic part comprises (e.g., consists essentially of) Ti and the compound part comprises (e.g., consists essentially of) silicon nitride and titanium oxide.

In yet another subgroup of the present embodiment group, the metallic part comprises (e.g., consists essentially of) Si and the compound part comprises (e.g., consists essentially of) SiO and $SiO_2$.

In still another subgroup of the present embodiment group, the metallic part comprises (e.g., consists essentially of) Si and the compound part comprises (e.g., consists essentially of) $Si_3N_4$ and $SiO_2$.

In yet another subgroup of the present embodiment group, the metallic part comprises (e.g., consists essentially of) Si and the compound part comprises (e.g., consists essentially of) $Si_3N_4$ and SiO.

The invention provides a number of embodiments of the present group wherein the reactive sputtering process involves: arranging a reduced erosion area on the desired target, the reduced erosion area having a size equal to or smaller than a critical size needed for the reactive sputtering process to proceed with an eliminated hysteresis behaviour, and; causing movement of the reduced erosion area along the desired target at a constant or variable speed, the speed being selected so as to be above a minimum speed to avoid melting of the desired target's sputterable material. Here, the step of arranging can optionally comprise arranging at least one magnet behind the target and imposing a relative movement between the magnet and the target. Further, the target can optionally have a cylindrical tube shape, such that sputtering takes place (e.g., at a fixed location relative to the substrate) as the target is being rotated.

The invention also provides certain embodiments of the present group wherein the reactive sputtering process is carried out in a sputtering chamber having a shield and both reactive and inert gas inlets. In some embodiments of this nature, the chamber has inert gas inlets located (and operated) so as to deliver inert gas into an upper region (which is adjacent to the desired target) of the chamber, the chamber has reactive gas inlets located (and operated) so as to deliver reactive gas into a lower region (which is adjacent to the substrate to be coated) of the chamber, the shield is at a higher elevation than the reactive gas inlets, and the inert gas inlets are at a higher elevation than the shield. Some of these embodiments involve delivering only inert gas through the inert gas inlets. In some of the present embodiments, the chamber has a transport support (such as transport rollers and/or a conveyor belt) adapted to support (optionally while conveying) a sheet-like substrate in a horizontal position, and the shield has a downwardly deflected region that is not parallel to the horizontal substrate position but rather is oblique to this horizontal position. In some such cases, the downwardly deflected region of the shield is that portion of the shield that is furthest from an adjacent sidewall of the chamber. Optionally, a first distance is defined as being the vertical distance between the desired target and the horizontal substrate position, a second distance is defined as being the vertical distance between the desired target and the shield, and the second distance is greater than 40%, or perhaps greater than 50%, of the first distance. In some embodiments, the shield protrudes about 3-4 inches from the chamber sidewall to which it is attached, and this exemplifies embodiments wherein the shield protrudes inwardly from the chamber sidewall by less than 10 inches.

In certain embodiments, the direction of the coating process is directed upwardly (e.g., in a sputter-up coater system) or sideways (e.g., in a vertical coater system). Thus, the directions noted above are modified accordingly. For example, the invention provides certain embodiments wherein the chamber has inert gas inlets located (and operated) so as to deliver inert gas into a first region (which is adjacent to the desired target) of the chamber, the chamber has reactive gas inlets located (and operated) so as to deliver reactive gas into a second region (which is adjacent to the substrate surface to be coated) of the chamber, the shield is closer to the target than the reactive gas inlets, and the inert gas inlets are closer to the target than the shield. Some of these embodiments involve delivering only inert gas through the inert gas inlets. In some of these embodiments, the chamber has a transport support (such as transport rollers, a conveyor belt, and/or a generally vertical conveyance platen) adapted to support (optionally while conveying) a sheet-like substrate in a desired position (or orientation), and the shield has a deflected region that is not parallel to the desired substrate position but rather is oblique to this position. In some such cases, the deflected region of the shield is that portion of the shield that is furthest from an adjacent wall (e.g., the wall to which the shield is attached) of the chamber. Optionally, a first distance is defined as being the distance between the desired target and the desired substrate position, a second distance is defined as being the distance between the desired target and the shield, and the second distance is greater than 40%, or perhaps more preferably greater than 50%, of the first distance.

Certain embodiments of the invention provide the above-noted target composition in combination with the above-noted reduced erosion area, and/or in combination with employing a sputtering chamber having a shield with one or more of the features described herein.

BRIEF DESCRIPTION OF THE DRAWINGS

The invention, together with some of the advantages thereof, can best be understood by making reference to the following description taken together with the accompanying drawings, in which:

FIG. 6 is a schematic side view of an exemplary sputtering chamber that can be used in accordance with certain embodiments of the invention.

DETAILED DESCRIPTION

Figure 1:
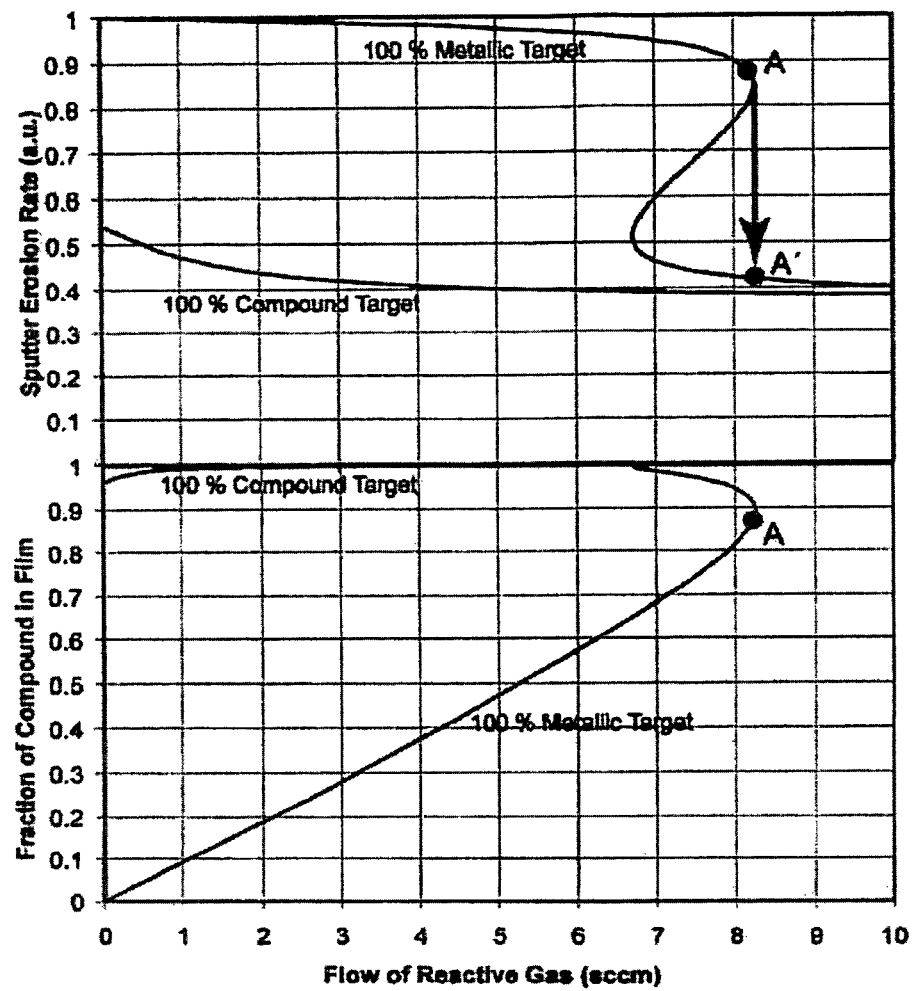
FIG. 1 shows simulated sputtering erosion rates (top) and substrate compositions (bottom) vs. reactive gas flow in a reactive sputtering system using a metallic target as well as a target made completely of compound material.

FIG. 1 shows simulated sputtering erosion rates (top) and substrate compositions, i.e., fraction of compound in the film deposited on the substrate (bottom) vs. reactive gas flow in a reactive sputtering system using a metallic target as well as a target made completely of compound material (such as a fully oxidized target material). FIG. 1 reveals that the relation between the sputter erosion rate and the flow of reactive gas is very complex and non-linear. For the metallic target the process will, in fact, exhibit a hysteresis behavior if the flow of reactive gas is first increased and then decreased. Low reactive gas flows give high sputter erosion rates and almost metallic films. Higher flows slowly reduce the erosion rate while the film gets more compound rich. At point A (indicated in FIG. 1), the process will avalanche from a processing point characterized by high rate to point A' characterized by low rate (this avalanche type of transition is indicated by an arrow in FIG. 1). The former processing point (A) corresponds to metallic mode since the target surface mainly consists of unreacted metal with a high sputtering yield and the latter point (A') corresponds to compound mode. In some cases, it is possible to deposit a film which is sufficiently compound rich by operating the process close to point A. This implies a high sputter erosion rate but fluctuations and drift in the process can easily push the process into the low rate compound mode. In other cases, the optimum processing point is inside the hysteresis. Nevertheless, operation of the process very close to the hysteresis edge, or inside the hysteresis region, requires a feed-back control unit to avoid avalanching of the process. To ensure a sufficiently compound rich film without risk of avalanching into either of the modes, it is of course possible to run the process at a very high reactive gas flow corresponding to processing points in the low rate compound mode. The obvious drawback with this approach is the low deposition rate.

It is further seen in FIG. 1 that the compound target gives a hysteresis-free process. Low flows of reactive gas give a low sputter erosion rate and almost completely compounded films. An increase of the reactive gas flow gives only a slight and smooth transition to somewhat lower sputter erosion rate and completely compounded films. The price for a hysteresis-free process is, also in this case, a very low erosion rate.

The simulated results in FIG. 1 have been confirmed by experiments in, for example, Kappertz et. al. in J. Vac. Sci. Technol. A20 (6), 2084, 2002. This work discloses comparisons between the deposition rates for a Zn target and a ZnO target doped with approximately 2% Al. The additional aluminum is, in this case, incorporated into the target in order to make it more conductive, which in turn facilitates sputtering by means of a DC power supply. It is relatively common to add a small amount of metal to materials with a poor conductivity for this purpose. For example, targets made from $TiO_2$ are often somewhat substoichiometric for the same reasons. It should be noted that the purpose of adding the metal in such cases is to provide a target with a sufficiently high conductivity to facilitate sputtering. In the method according to the present invention, metal is mixed with compound material in quantities that do not just increase conductivity, but actually reduce (e.g., significantly) or eliminate the hysteresis effect. The relative amount of metal needed to provide a target with conductivity high enough to facilitate sputtering is typically significantly lower than the optimum relative amount of metal provided to significantly reduce or eliminate hysteresis in accordance with the teachings of this disclosure. Thus, the relative amount of metal in the sputterable target material typically is greater than 2%, and in some cases is greater than 5%, such about 65% in one exemplary embodiment.

Figure 2:
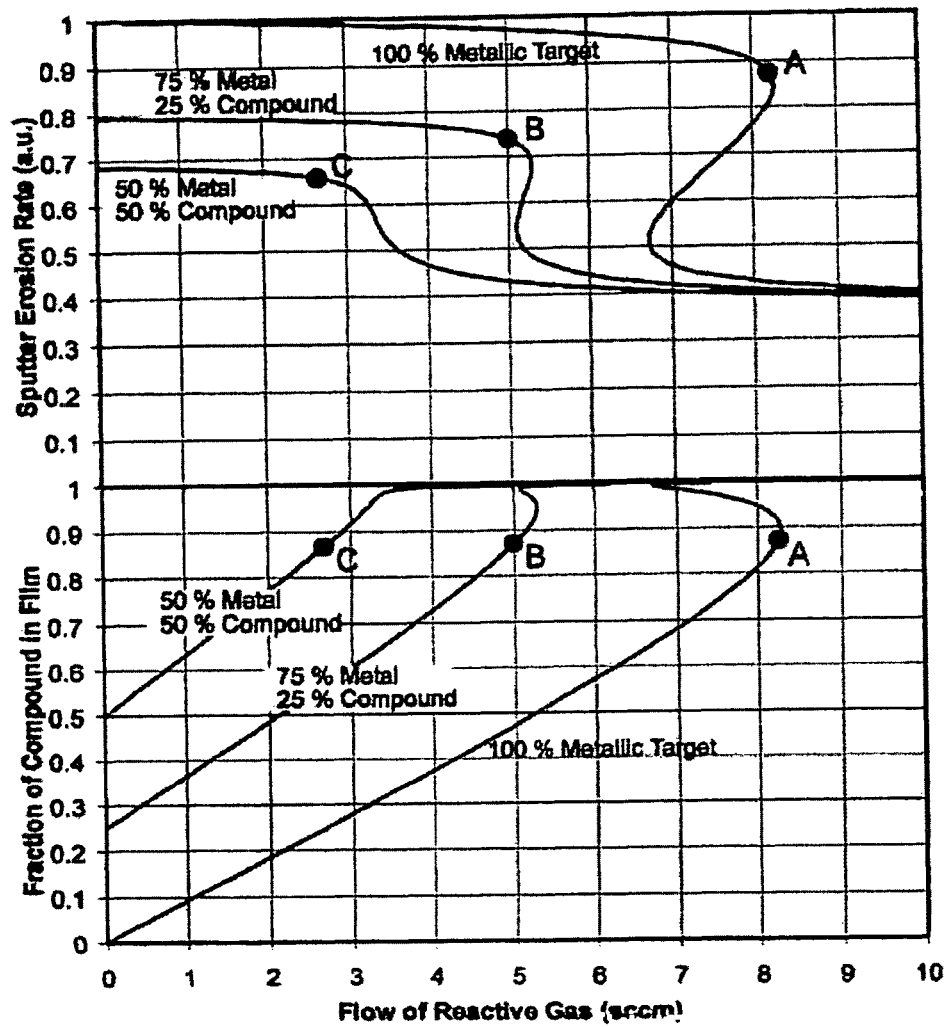
FIG. 2 shows simulated sputtering erosion rates (top) and substrate compositions (bottom) vs. reactive gas flow in a reactive sputtering system using a metallic material as well as two different target types in accordance with certain embodiments of the invention.

The present invention is based on a method and/or equipment to obtain a reactive sputtering process with a reduced (e.g., significantly reduced) or eliminated hysteresis behavior by employing a target made from a mixture of metal and compound material. FIG. 2 illustrates how the processing behavior changes qualitatively for different relative amounts of metal and compound material. The curves for the metallic target are the same curves as shown in FIG. 1 and are included for reference. The other curves in FIG. 2 correspond to targets having relative metal/compound mixtures of 75/25 and 50/50, respectively. The points B and C indicate operating points giving the same film composition as point A for the metallic target. It is clearly seen that a larger amount of compound material in the target implies not only a reduced, and ultimately an eliminated, hysteresis but also a reduced sputtering erosion rate. The curves corresponding to a target made from 50% compound and 50% metal exhibit no hysteresis, which means that the process can be controlled simply by varying the reactive gas flow. Certain embodiments, for example, provide a target material that is not fully oxidized, but rather has both metallic areas (optionally accounting for greater than 2%, or even greater than 5%, of the target material) and oxide areas, and the composition of the target is, in particular, such that it can be reactively sputtered (optionally while depositing a fully oxidized film) without hysteresis. Referring again to FIG. 2, it is further seen that it is possible to deposit a compound film at a higher (e.g., significantly higher) rate than the corresponding rate for a metallic target operated in compound mode (e.g., oxide mode), or for a target made completely from the compound material (see FIG. 1). Nevertheless, the rate is lower than corresponding rate from a metallic target (see the rate difference between point A and C in FIG. 2). In many cases, this rate reduction is relatively small and considered a low price to pay for a hysteresis-free process. The general magnitude of the rate reduction is difficult to quantify since it is process dependent. Assume, for example, that the pumping speed is relatively high and the sputtering equipment is otherwise designed for reducing the hysteresis effect. In such cases, the hysteresis width might be relatively small for a metallic target, implying that it is sufficient to have a relatively small fraction of compound material in the target to eliminate hysteresis, resulting in a relatively modest reduction in erosion rate. The opposite is true if the hysteresis is very large for a metallic target in a given system. In these cases, a large fraction of compound material is preferably incorporated into the target to eliminate hysteresis, which leads to a considerably larger drop in sputter erosion rate. In some cases where the materials used in forming a compound (e.g., $TiO_2$) are highly reactive, this tends to cause a more severe hysteresis effect. Some related embodiments, therefore, provide in the target a compound (such as TiN), the formation of which from the common material (e.g., Ti) is less reactive.

The foregoing discussions serves to illustrate the difficulty associated with giving globally applicable quantitative figures for the relative metal/compound-mixtures needed to eliminate hysteresis for any target. The curves in the FIGS. 1 and 2 are general curves that qualitatively illustrate trends and behavior in a reactive sputtering process.

Although it is difficult to give a global specification for the preferred target composition, it is possible to determine the preferred composition for a specific process and/or for a certain sputter deposition system. To do this, one can increase the fraction of compound in the target and then consider the resulting hysteresis behaviour. If the hysteresis effect has been eliminated, or decreased to such an extent that stable deposition of compound films is achievable at a rate higher (e.g., significantly higher) than the corresponding rate for a target made completely from the compound material, then it can be concluded that the fraction of compound material in the target is sufficiently high. Otherwise, the fraction of compound in the target should be increased until the criterion regarding the deposition of compound films described above is fulfilled.

There can also be advantages even if the hysteresis is not completely eliminated. In FIG. 2, the curves corresponding to a target made from 25% compound and 75% metal exhibit a small but well defined hysteresis. It is further seen that films with the same composition as in point A can be deposited at point B at a lower deposition rate. Since point B, compared to point A, is further away from the point were the process is avalanching down to compound mode, it is possible to operate the process more stable in processing point B than in point A. This advantage can sometimes make up for the reduced deposition rate. The 25% compound/75% metal situation is exemplary of embodiments involving a target material having at least 20% compound (optionally a compound selected from the group consisting of oxide, nitride, and oxynitride), with the remainder being metallic material.

Further, it is to be appreciated that films are commonly produced in one and the same deposition chamber (or coater) having a fairly constant pumping speed which means that the operator may have only to find out the optimum target composition once, for that particular system, and stick to this composition in future processing.

The discussion above serves to illustrate that certain methods of the invention might very well be used so as to eliminate hysteresis completely, while in other cases it may simply be used so as to reduce hysteresis. In some cases, this may be a trade off between stability and rate.

Some embodiments provide a sputterable target material comprising (optionally consisting essentially of) a mixture of metal and compound (e.g., metal oxide) characterized by a plurality of areas of metallic material (or "metallic regions") and a plurality of areas of compound material (or "compound regions"), where the metallic regions and the compound regions are substantially uniformly distributed over all areas of the sputterable target material. For example, taking cross sections of such sputterable target material at any two different locations on the target may show substantially identical ratios of total compound region area to total metal region area. In some embodiments of this nature, the compound regions are oxide regions, nitride regions, and/or oxynitride regions.

In one group of embodiments, at least one of the metallic part and the compound part includes one or more elements selected from the group consisting of zinc, niobium, bismuth, and aluminum.

One embodiment provides a sputterable target material wherein at least one of the metallic part and the compound part includes one or more elements selected from the group consisting of zinc, tin, titanium, niobium, zirconium, bismuth, and aluminum, but is substantially free of silicon and boron.

The most common coating in reactive sputtering would be a compound film containing one metal, e.g., ZnO, such that the target (or at least that part of the target that is intended to be sputtered) would be made from a mixture of that single metal and a corresponding compound including that metal (an oxide of that metal, a nitride of that metal, an oxynitride of that metal, etc.), such as a mixture of metallic Zn and zinc oxide.

One group of embodiments provides a sputterable target material comprising (optionally consisting essentially of) a mixture of zinc metal and zinc oxide. In some embodiments of this nature, the target material is characterized by a plurality of metallic zinc regions and a plurality of zinc oxide regions, where the metallic zinc regions and the zinc oxide regions are substantially uniformly distributed throughout all areas of the sputterable target material. Metallic zinc targets are known to have firefly and/or sparkle problems associated with their high reactive sputtering rates. In some embodiments, the targets of the present invention are provided with a view toward eliminating or reducing these firefly and/or sparkle problems. In some cases, there is provided a sputterable target material comprising (optionally consisting essentially of) a mixture of: (1) a metallic material including (optionally consisting essentially of) zinc and tin; and (2) an oxide material comprising both (optionally consisting essentially of) zinc oxide and tin oxide. In other cases, there is provided a sputterable target material comprising (optionally consisting essentially of) a mixture of: (1) metallic zinc; and (2) an oxide material comprising (optionally consisting essentially of) both zinc oxide and tin oxide. In still other cases, there is provided a sputterable target material comprising (optionally consisting essentially of) a mixture of: (1) metallic zinc; and (2) an oxide material comprising (optionally consisting essentially of) tin oxide. In yet other cases, there is provided a sputterable target material comprising (optionally consisting essentially of) a mixture of: (1) metallic tin; and (2) an oxide material comprising (optionally consisting essentially of) both zinc oxide and tin oxide. In still other cases, there is provided a sputterable target material comprising (optionally consisting essentially of) a mixture of: (1) metallic tin; and (2) an oxide material comprising (optionally consisting essentially of) zinc oxide. In any of the embodiments disclosed herein, the desired metallic regions can optionally be discrete areas of metallic material and the desired compound regions can optionally be discrete areas of compound material, and the metallic regions and the compound regions can optionally be substantially uniformly distributed throughout all areas of the sputterable target material. Thus, hysteresis can also be reduced when a first metal is mixed with a compound of a second metal.

Generally, hysteresis can be reduced (e.g., significantly), and ultimately eliminated, by using a target comprising (optionally consisting essentially of) a mixture of one metallic part, consisting essentially of one or more metals, and one compound part, consisting essentially of one or more compound materials, provided that the relative amount of compound material is large enough. It should be noted that the compound part can optionally include several compounds involving the same metal and the same reactive gas atoms, e.g., SiO and $SiO_2$, one metal and different reactive gases, e.g., AlN and $Al_2O_3$, etc.

In some embodiments, the sputterable target material includes (e.g., consists essentially of) a metallic part comprising (e.g., consisting essentially of) titanium and silicon and a compound part comprising (e.g., consisting essentially of) titanium oxide. In these embodiments, the relative percentages of the metal part and the compound part can be within any exemplary range noted in this disclosure.

Certain embodiments provide a sputterable target material that includes (e.g., consists essentially of) a metallic part comprising (e.g., consisting essentially of) titanium and a compound part comprising (e.g., consisting essentially of) silicon oxide and titanium oxide. Here again, the relative percentages of the metal part and the compound part can be within any exemplary range noted in this disclosure.

In certain embodiments, the sputterable target material includes (e.g., consists essentially of) a metallic part comprising (e.g., consisting essentially of) silicon and a compound part comprising (e.g., consisting essentially of) titanium oxide. In one embodiment of this nature, the target material comprises about 65% silicon and about 35% titanium oxide.

In some embodiments, the sputterable target material includes (e.g., consists essentially of) a metallic part comprising (e.g., consisting essentially of) Ti and a compound part comprising (e.g., consisting essentially of) silicon oxide and titanium nitride. The relative percentages of the metal part and the compound part can be within any exemplary range noted in this disclosure.

Certain embodiments provide a sputterable target material that includes (e.g., consists essentially of) a metallic part comprising (e.g., consisting essentially of) Ti and a compound part comprising (e.g., consisting essentially of) silicon nitride and titanium oxide. The relative percentages of metal part and compound part can be within any range noted in this disclosure.

Some embodiments provide a sputterable target material that includes (e.g., consists essentially of) a metallic part comprising (e.g., consisting essentially of) silicon and a compound part comprising (e.g., consisting essentially of) silicon oxide such as a combination of SiO and $SiO_2$. The relative percentages of the metal part and the compound part can be within any exemplary range noted in this disclosure.

In certain embodiments, there is provided a sputterable target material that includes (e.g., consists essentially of) a metallic part comprising (e.g., consisting essentially of) Si and a compound part comprising (e.g., consisting essentially of) $Si_3N_4$ and $SiO_2$. The relative percentages of metal part and compound part can be within any range noted in this disclosure.

In some embodiments, there is provided a sputterable target material comprising (e.g., consisting essentially of) a metallic part comprising (e.g., consisting essentially of) Si and a compound part comprising (e.g., consisting essentially of) silicon nitride and SiO. The relative percentages of metal part and compound part can be within any range noted in this disclosure.

In certain embodiments, the target is a rotatable target. For example, the target may have a cylindrical backing tube that carries an outer thickness of the sputterable target material. In some cases, the target has a length greater than 0.5 meter, greater than 0.75 meter, greater than 1 meter, greater than 1.25 meters, greater than 1.5 meters, greater than 2 meters, or even greater than 3 meters. Thus, the target can optionally be adapted for sputter depositing over an entirety of a major surface of a large-area substrate, such as a glass or plastic sheet having a major dimension that is greater than any one or more of the dimensions noted in this paragraph.

The target might be produced by means of any suitable prior-art or future manufacturing method. For example, an exemplary target could be formed by plasma spraying silicon powder and $TiO_2$ powder onto a target backing tube. In some embodiments, the target is made out of one metallic part and one part consisting essentially of compound material, where the relative amounts of these parts are determined by the requirements of the magnitude of hysteresis reduction for the process in question. In one embodiment, $TiO_2$ powder (and/or $SiO_2$ powder) is plasma sprayed onto a backing tube in a reducing atmosphere that contains nitrogen.

Certain embodiments of the invention (e.g., those involving only the mixed target feature, without being provided in a combination with a shield and/or a reduced erosion area) can be implemented on existing sputtering equipment without changing anything other than one or more targets. In other embodiments, the invention provides processes and/or equipment that provide the mixed target feature in combination with a shield and/or a reduced erosion area. These features will now be described.

Figure 3A:
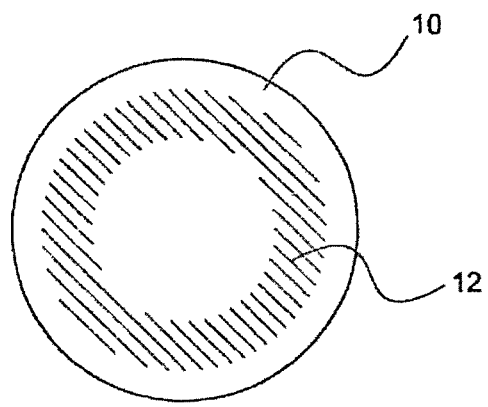
FIG. 3A schematically illustrates the erosion track on a typical prior art DC-magnetron target.

FIG. 3A illustrates the erosion track on a typical prior art DC-magnetron target. Sputtered material is removed from a target 10, whereby an erosion track 12 is formed at the surface of the target 10. Conventional DC-magnetron targets 10 typically have ring-shaped erosion areas extending over a substantial part of the target. Other shapes of targets and erosion areas are also used in industrial applications. In the large area deposition industry, it is common to use cylindrically shaped targets. Here, the sputtering takes place from the outer parts of the target from an erosion area parallel to the cylinder-axis. This can be achieved by inserting rod magnets inside the cylindrically shaped target.

Figure 3B:
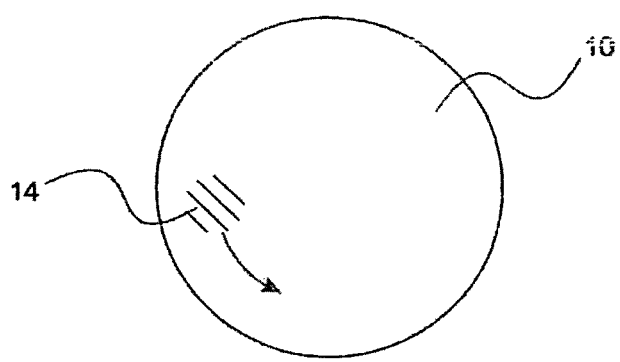
FIG. 3B is a schematic exemplary illustration of a reduced area in constant motion according to certain embodiments of the present invention.

The present embodiments are based on a method to obtain a reactive sputtering process with a reduced (e.g., significantly reduced) or eliminated hysteresis behaviour by reducing the area from which sputtering takes place. Any conventional power supply can be used to generate the ion current to the target, for example DC, RF or pulsed DC power supplies. FIG. 3B is an exemplary illustration of a reduced erosion area, in constant motion according to certain embodiments of the present invention. To avoid local heating of the target 10, the reduced erosion area 14 can optionally be in constant motion, which in FIG. 3B is indicated by an arrow. Other embodiments may involve other shapes of the reduced erosion area 14, which does not have to be circular. However, it is desirable for the reduced erosion area 14 to be in constant motion to avoid local melting of the target 10. This ensures that the power is spread out so the average heating over the area of the target 10 is essentially the same as for the large erosion area 12. Of course, embodiments with other types of targets, such as the previously mentioned cylindrical target, may also be used in the present embodiments.

There are several ways of accomplishing the small erosion area 14 in motion in accordance with the present embodiments. One approach is to place a small moving magnet behind the target 10. Another approach is to arrange a moving shutter with a small aperture close to the surface of the target 10. The shutter will effectively prevent plasma discharge except at the position of the aperture. For cases where magnets and/or shutters or the like are used to define the erosion zone, moving the target is equivalent to moving the magnets/shutters. Yet another way of obtaining the desired small erosion area 14 in motion would be to split up the target 10 in several parts electrically isolated from each other. By distributing power to one part at a time, it is possible to control the location of the plasma discharge and thereby the area from which sputtering takes place similarly as in the previous approaches. Other possible approaches to obtain a small erosion area 14 in motion along the target 10 also lie within the scope of the present embodiments.

Preferably, at least two parameters are controlled in a method according to the present embodiments; the size of the reduced erosion area 14 and the speed at which 14 the erosion area is moving along the target 10. As will be evident in the following text, several effects related to these parameters are preferably considered.

Figure 4:
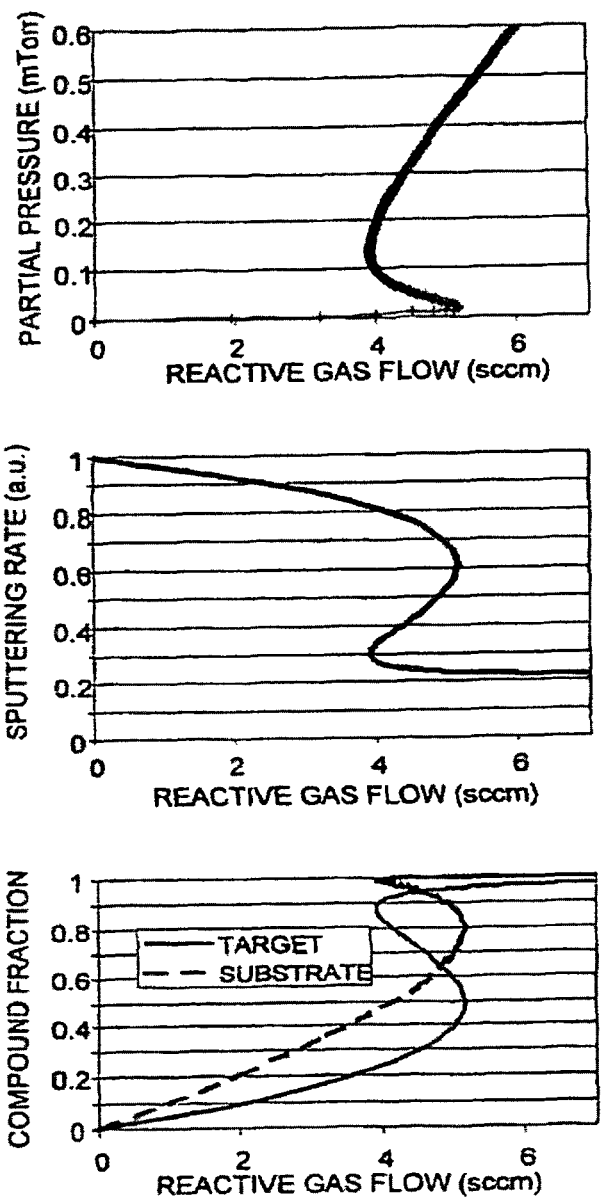
FIG. 4 shows reactive gas pressure, sputtering rate and target—and substrate composition versus reactive gas flow in a reactive sputtering system using a conventional target of normal size.
Figure 5:
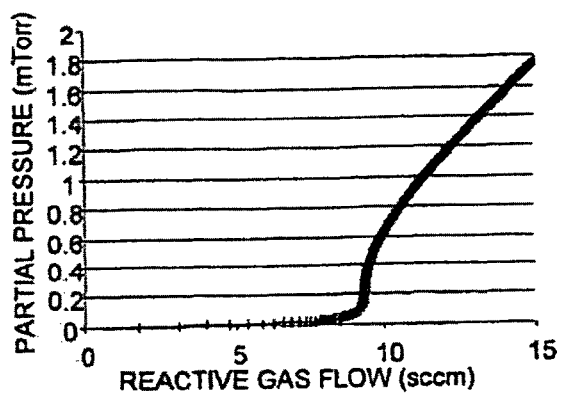
FIG. 5 shows reactive gas pressure, sputtering rate and target—and substrate composition versus reactive gas flow in a reactive sputtering system with a small sized erosion area in accordance with certain embodiments of the present invention.
Figure 5:
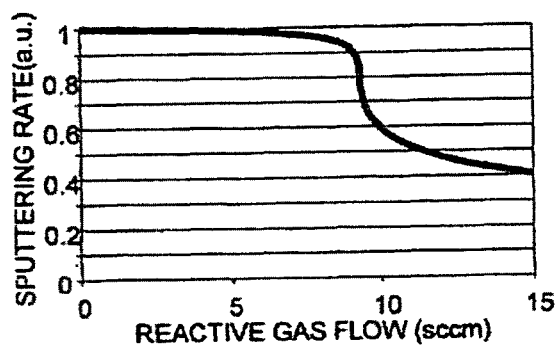
Figure 5:
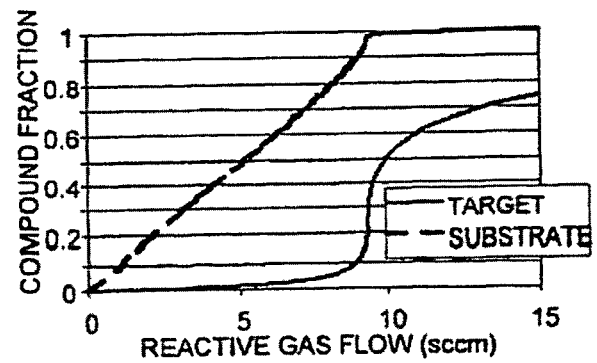

FIG. 4 shows results from simulations of a reactive sputtering system with a target and erosion area of normal size while FIG. 5 shows simulations of a system with a significantly smaller erosion area. The erosion area resulting in FIG. 5 is approximately 30 times smaller than the one resulting in FIG. 4. Graphs of partial reactive gas pressure, sputtering rate, and fraction of compound are shown. It is evident that the hysteresis behavior disappears when the erosion area is significantly reduced. In fact, it can be shown that the hysteresis behaviour can be eliminated by a sufficiently small erosion area. It should be noted that increasing the current density by increasing the total current while maintaining a large erosion area would not eliminate the hysteresis behaviour. Accordingly, it is from this point of view beneficial to have as small erosion area as possible. But because of cooling problems it is not practicable to have an arbitrarily small erosion area. Under certain circumstances it is equivalent to make use of the moving erosion area 14 described above, instead of using the conventional target 10 with a static erosion track 12 of the same size. But for reasons givens above, a moving erosion area can be made much smaller than a static one. This small erosion area has the advantage that a high current density is achieved, which in turn gives a hysteresis-free process as seen in FIG. 5.

The size of the erosion area required to obtain the desired positive effects depends on the employed type of sputtering deposition system. To find out the size needed to obtain the positive effects, one has to reduce the erosion area and then consider the hysteresis behaviour for the particular system. If the hysteresis effect has been eliminated or significantly reduced, or decreased to such an extent that deposition of fully stoichiometric compound films is achievable at a rate close to a metallic sputtering rate, it can be concluded that the erosion area has been reduced sufficiently to obtain the desired effect. The same effect may also be obtained if several erosion zones are used instead of one, as long as the total area does not exceed the size needed to obtain this effect. The reduced erosion area can be moved continuously over the surface at constant or variable speed. According to one embodiment of the invention, the erosion zone is caused to jump from one position to another, e.g., by slitting up the target into electrically isolated parts and distributing power to one part at a time.

The speed of the erosion area 14 preferably is higher than a certain minimum speed in order to avoid local excessive overheating or melting of the target 10.

FIG. 6 exemplifies embodiments involving a sputtering chamber that is provided with both the present target and an advantageous shield arrangement. Here, the reactive sputtering process is carried out in a chamber having a shield 80 and both reactive 40 and inert 20 gas inlets. In the exemplary case of FIG. 6, the chamber has inert gas inlets 20 located (and operated) so as to deliver inert gas into an upper region UR of the chamber, the chamber has reactive gas inlets 40 located (and operated) so as to deliver reactive gas into a lower region LR of the chamber, the shield 80 is at a higher elevation than the reactive gas inlets 40, and the inert gas inlets 20 are at a higher elevation than the shield 80. Some of these embodiments involve delivering only inert gas through the inert gas inlets 20. In certain embodiments, the chamber has a transport support (such as transport rollers 130 and/or a conveyor belt) adapted to support (optionally while conveying) a sheet-like substrate 300 in a horizontal position, and the shield 80 has a downwardly deflected region 85 that is not parallel to the horizontal substrate position but rather is oblique to this horizontal position. In some such cases, the downwardly deflected (e.g., angled and/or curved) region 85 of the shield 80 is that portion of the shield furthest from an adjacent sidewall of the chamber. Optionally, a first distance D1 is defined as being the vertical distance between the desired target 10 and the horizontal substrate position, a second distance D2 is defined as being the vertical distance between the desired target 10 and the shield, and the second distance is greater than 40%, or perhaps more preferably greater than 50%, of the first distance.

In certain embodiments, the direction of the coating process is directed upwardly (e.g., in a sputter-up coater system) or sideways (e.g., in a vertical coater system). In such cases, the directions noted above are modified accordingly. For example, the invention provides certain embodiments wherein the chamber has inert gas inlets located (and operated) so as to deliver inert gas into a first region (which is adjacent to the desired target) of the chamber, the chamber has reactive gas inlets located (and operated) so as to deliver reactive gas into a second region (which is adjacent to the substrate surface to be coated) of the chamber, the shield is closer to the target than are the reactive gas inlets, and the inert gas inlets are closer to the target than is the shield. Some of these embodiments involve delivering only inert gas through the inert gas inlets. In some of these embodiments, the chamber has a transport support (such as transport rollers, a conveyor belt, and/or a generally vertical conveyance platen) adapted to support (optionally while conveying) a sheet-like substrate in a desired position (or orientation), and the shield has a deflected region that is not parallel to the desired substrate position but rather is oblique to (optionally offset from by at least 5 degrees relative to) this position. In some such cases, the deflected region of the shield is that portion of the shield that is furthest from an adjacent wall (e.g., the wall to which the shield is attached) of the chamber. Optionally, a first distance is defined as being the distance between the desired target and the desired substrate position, a second distance is defined as being the distance between the desired target and the shield, and the second distance is greater than 40%, or perhaps more preferably greater than 50%, of the first distance.

The various embodiments of the present disclosure can optionally employ a sputtering process involving two different reactive gases, such as oxygen and nitrogen. Thus, the method can involve flowing two different reactive gases into the sputtering chamber. This can be done in combination with any one or more of the above-noted hysteresis reduction features. In an oxidizing sputtering process, adding a reactive gas that is not as highly reactive (e.g., to the element(s) being sputtering) as oxygen (e.g., nitrogen in some embodiments) can reduce the hysteresis width. In some cases, the metal part of the target material comprises titanium, and the reactive sputtering involves a gaseous atmosphere comprising both oxygen and nitrogen.

It will be understood by those skilled in the art that modifications and changes may be made to the present invention without departure from the scope and spirit thereof, as defined by the appended claims.

The invention claimed is:

1. A method comprising:
(a) employing a desired target including a target material comprising a mixture of one metallic part, consisting essentially of one or more metals and/or one or more semiconducting materials, and one compound part, consisting essentially of one or more oxide materials, wherein the relative amount of compound part is between 30% and 50% of the target material and is large enough to:
    i) eliminate or reduce a hysteresis behavior of the reactive sputtering process as compared to reactively sputtering a metal target completely made from said metallic part, and
    ii) enable a stable deposition of a compound film at a rate higher than what is possible from a given target completely made from said compound part;
wherein at least one of the metallic part and the compound part includes one or more elements selected from the group consisting of zinc, tin, titanium, niobium, zirconium, bismuth, and aluminum, the target material being substantially free of silicon; and
(b) depositing a fully oxidized coating on a substrate.

2. The method according to claim 1, wherein the reactive sputtering process is a sputtering process selected from the group consisting of DC sputtering and mid-frequency sputtering.

3. The method according to claim 1, wherein said desired target has a composition selected to have an electrical conductivity that is at least twice that of said given target, which is completely made from said compound part.

4. The method according to claim 1, wherein the mixture for said desired target is selected so that the stable deposition of said compound film proceeds with the rate being at least 40% that achieved by reactively sputtering said metal target, which is completely made from said metallic part.

5. The method according to claim 4, wherein said rate is at least 50% that achieved by reactively sputtering said metal target, which is completely made from said metallic part.

6. The method according to claim 5, wherein said rate is at least 60% that achieved by reactively sputtering said metal target, which is completely made from said metallic part.

7. The method according to claim 1, wherein said desired target has a composition selected to have a thermal conductivity that is at least twice that of said given target, which is completely made from said compound part.

8. The method according to claim 1, wherein the method is performed such that after a disruption of the reactive sputtering process said process returns to a working point by which said stable deposition of said compound film was characterized prior to said disruption.

9. The method according to claim 1, wherein the reactive sputtering process involves:
    arranging a reduced erosion area on the desired target, the reduced erosion area having a size equal to or smaller than a critical size needed for the reactive sputtering process to proceed with an eliminated hysteresis behavior, and
    causing movement of the reduced erosion area along the desired target at a constant or variable speed, the speed being selected so as to be above a minimum speed to avoid melting of the desired target's target material.

10. The method according to claim 9, characterized in that the step of arranging comprises arranging at least one magnet behind the target and imposing a relative movement between the magnet and the target.

11. The method according to claim 9, characterized in that the target has a cylindrical tube shape, and sputtering takes place as the target is being rotated.

12. The method according to claim 9, characterized in that the step of arranging comprises splitting up the target into electrically isolated parts and distributing power to one part at a time.

13. The method according to claim 1, wherein the method comprises performing said reactive sputtering process in a sputtering chamber that is provided with a shield, the chamber having inert gas inlets located so as to deliver inert gas into an upper region of the chamber, the chamber further including reactive gas inlets located so as to deliver reactive gas into a lower region of the chamber, wherein said shield is at a higher elevation than said reactive gas inlets, and wherein said inert gas inlets are at a higher elevation than said shield.

14. The method according to claim 13, wherein the chamber has a transport support that is adapted to support a sheet-like substrate in a horizontal position, and wherein the shield has a downwardly directed region that is not parallel to said horizontal substrate position but rather is oblique to said horizontal substrate position.

15. The method according to claim 14, wherein the downwardly directed region of the shield is that portion of the shield that is furthest from an adjacent sidewall of the chamber.

16. The method according to claim 14, wherein a first distance is defined as being the vertical distance between the desired target and said horizontal substrate position, a second distance is defined as being the vertical distance between the desired target and said shield, and wherein said second distance is greater than 40% of said first distance.

17. The method according to claim 1, wherein the method comprises performing said reactive sputtering process in a sputtering chamber that is provided with a shield, the chamber having inert gas inlets located so as to deliver inert gas into a first region of the chamber, the chamber further including reactive gas inlets located so as to deliver reactive gas into a second region of the chamber, wherein the shield is closer to the desired target than are the reactive gas inlets, and wherein the inert gas inlets are closer to the desired target than is the shield.

18. The method according to claim 1, wherein the reactive sputtering process achieves said deposition of said compound film while consuming a sputtering energy that is 50% or less of a sputtering energy that would be consumed in producing a film having the same composition and thickness when either sputtering said metal target, which is completely made from said metal part, or said given target, which is completely made from said compound part.

19. The method according to claim 1, wherein said compound part includes a first compound and a second compound.

20. The method according to claim 19, wherein during the reactive sputtering process said metallic part forms said first compound more readily than it forms said second compound.

21. The method according to claim 19, wherein the reactive sputtering process involves providing a gaseous sputtering atmosphere comprising two reactive gases of different chemical activities.

22. The method according to claim 21, wherein during said reactive sputtering process said deposition of the compound film results in said film containing a higher concentration of a desired one of the two reactive gases, said desired one of the two reactive gases having a higher chemical activity than the other of said two reactive gases.

23. The method according to claim 1, wherein the relative amount of compound part is large enough to eliminate the hysteresis behavior of the reactive sputtering process as compared to reactively sputtering the metal target completely made from the metallic part.

24. The method according to claim 1, wherein the target material is substantially free of silicon and boron.

25. The method according to claim 1, wherein the one or more oxide materials includes an oxide of a metal included in the metallic part and/or an oxide of a semiconducting material included in the metallic part.

* * * * *